United States Patent
Mu

(10) Patent No.: US 7,486,135 B2
(45) Date of Patent: Feb. 3, 2009

(54) CONFIGURABLE, VARIABLE GAIN LNA FOR MULTI-BAND RF RECEIVER

(75) Inventor: Fenghao Mu, Hjärup (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 98 days.

(21) Appl. No.: 11/754,696

(22) Filed: May 29, 2007

(65) Prior Publication Data

US 2008/0297259 A1 Dec. 4, 2008

(51) Int. Cl.
*H03F 1/14* (2006.01)
*H03F 3/68* (2006.01)

(52) U.S. Cl. .................. 330/51; 330/283; 330/295

(58) Field of Classification Search .......... 330/51, 330/283, 295
See application file for complete search history.

(56) References Cited

U.S. PATENT DOCUMENTS

| | | | |
|---|---|---|---|
| 5,710,519 A | 1/1998 | McClapin et al. |
| 6,049,251 A | 4/2000 | Meyer |
| 6,064,265 A | 5/2000 | Yun et al. |
| 6,127,887 A | 10/2000 | Cho |
| 6,218,899 B1 | 4/2001 | Ezell |
| 6,297,694 B1 | 10/2001 | Yamamoto |
| 6,396,347 B1 | 5/2002 | Lie et al. |
| 6,405,025 B1 | 6/2002 | Keski-Mattinen |
| 6,424,222 B1 | 7/2002 | Jeong et al. |
| 6,445,251 B1 | 9/2002 | Robinson |
| 6,472,936 B1 | 10/2002 | Jones |
| 6,586,993 B2 | 7/2003 | Macedo |
| 6,600,371 B2 | 7/2003 | Cali |
| 6,657,498 B2 | 12/2003 | Park et al. |
| 6,674,337 B2 | 1/2004 | Hashemi et al. |

(Continued)

FOREIGN PATENT DOCUMENTS

EP 1693957 A1 8/2006

(Continued)

OTHER PUBLICATIONS

Kawazoe, D. et al. "Reconfigurable CMOS Low Noise Amplifier for Self Compensation." Proceedings of the 2006 IEEE International Symposium on Circuits and Systems (ISCAS 2006), May 21-24, 2006, pp. 3410-3413, Kos/Greece.

(Continued)

*Primary Examiner*—Steven J Mottola
(74) *Attorney, Agent, or Firm*—Coats & Bennett, P.L.L.C.

(57) ABSTRACT

A configurable LNA architecture for a multi-band RF receiver front end comprises a bank of LNAs, each optimized to a different frequency band, wherein each LNA has a configurable topology. Each LNA comprises a plurality of amplifier stages, each stage including an RF transistor having a different width. The transistor widths in adjacent amplifier stages may be binary weighted, or may be sized to achieve a constant gain step. By selectively enabling and disabling RF transistors, the effective transistor width of the LNA can be controlled with a fine granularity. A DAC generates a bias voltage with a small quantization step, additionally providing a fine granularity of gain control. The LNAs are protected by overvoltage protection circuits which shield transistors from a supply voltage in excess of their breakdown voltage. A source degeneration inductor presents a real resistance at inputs of the LNAs, without introducing thermal noise.

38 Claims, 12 Drawing Sheets

U.S. PATENT DOCUMENTS

| | | | |
|---|---|---|---|
| 6,768,377 B2 | 7/2004 | Macedo | |
| 6,784,738 B1 | 8/2004 | Jin et al. | |
| 6,798,294 B2 | 9/2004 | Kuiri | |
| 6,806,777 B2 | 10/2004 | Franca-Neto | |
| 6,819,179 B2 | 11/2004 | Raja et al. | |
| 6,850,753 B2 | 2/2005 | Zhang et al. | |
| 6,897,729 B1 | 5/2005 | Jin et al. | |
| 6,919,761 B2 | 7/2005 | Cho et al. | |
| 6,933,779 B2 | 8/2005 | Lee et al. | |
| 6,977,553 B1 | 12/2005 | Jin et al. | |
| 7,023,272 B2 | 4/2006 | Hung et al. | |
| 7,031,691 B2 | 4/2006 | Brederlow | |
| 7,081,791 B2 | 7/2006 | Carpineto et al. | |
| 2005/0176399 A1 | 8/2005 | Aparin | |
| 2005/0231290 A1 | 10/2005 | Hung et al. | |
| 2005/0258896 A1 | 11/2005 | Bardsley et al. | |
| 2006/0052124 A1 | 3/2006 | Pottenger et al. | |
| 2006/0084469 A1 | 4/2006 | Malone et al. | |
| 2006/0170502 A1 | 8/2006 | Cha et al. | |
| 2006/0189286 A1* | 8/2006 | Kyu et al. | 455/144 |
| 2007/0001768 A1 | 1/2007 | Kim et al. | |
| 2007/0007598 A1 | 1/2007 | Woo et al. | |
| 2007/0021087 A1 | 1/2007 | Turner | |

FOREIGN PATENT DOCUMENTS

| | | |
|---|---|---|
| WO | 01/41302 A1 | 6/2001 |
| WO | 2006/086127 A1 | 8/2006 |

OTHER PUBLICATIONS

Pennisi, S. et al. "A New Design Approach for Variable-Gain Low Noise Amplifiers." IEEE Radio Frequency Integrated Circuits (RFIC) Symposium, Jun. 11-13, 2000, pp. 139-142, Boston, USA.

* cited by examiner

CONFIGURABLE, VARIABLE GAIN LNA FOR MULTI-BAND RF RECEIVER

BACKGROUND

The present invention relates generally to amplifiers, and in particular to a multi-band, configurable, variable gain, low noise amplifier (LNA) for radio frequency (RF) reception.

The LNA is an important component in wireless communication systems. Mobile terminals require a LNA to amplify very weak signals received at an antenna to a level sufficient for further processing, such as downconverting (mixing), demodulating, and decoding. Due to the mobile terminals' varying distance from a transmitter, shielding, fading, and other effects, RF signals are received at varying power levels. A variable gain LNA is desirable for properly amplifying the various received signals. For example, very weak signals require more amplification, and hence a higher gain, to reach an acceptable signal-to-noise ratio. However, a high-gain LNA will cause clipping of signals received with a higher power level, hence a lower gain is required.

Variable gain LNAs are known in the art. However, conventional variable gain LNA designs offer only very coarse gain adjustment, such as operating in either a low gain or high gain mode. Additionally, some conventional variable gain LNAs achieve the variation in gain by varying a resistance value connected in parallel with an inductive load. This introduces thermal noise into the amplified signal due to the physical resistive elements.

The application of weak RF signals also requires (as the name implies) low noise figures. Conventional fixed LNAs have different noise characteristics in different frequency bands, depending on the frequency for which the circuit is optimized. For multi-band RF receivers employing separate LNAs for different frequency bands, acceptable noise performance may require different designs for each LNA, optimizing the noise performance of each LNA for a particular frequency band. Multiple LNA designs in a single receiver increase development time and cost.

Another requirement of a LNA is linearity, to avoid interference. The linearity of a LNA is related to both over-drive voltage between the gate and source of a field effect transistor (FET), and FET drain current. Generally, increased over-drive voltage yields better linearity, at the price of higher power consumption. For long channel FET devices, the drain current is proportional to transistor width and the square of over-drive voltage. The gain of the LNA, $A_v$, is proportional to the transconductance $g_m$ which is related to the square root of the product of drain current $I_d$ and transistor width W:

$$A_v \propto g_m = \sqrt{\frac{2\mu_n C_{ox} W I_d}{L}}$$

Where $\mu n$ is mobility of electron, $C_{ox}$ is gate capacitance per unit area, and L is the channel length, respectively.

The gain can be adjusted by altering either the transistor width W or the drain current $I_d$. However, conventional LNAs either cannot alter both parameters, or can only do so in very coarse steps, e.g., high gain and low gain modes only. This form of gain control is not smooth, and the gain cannot be continuously tuned to optimally track received signal strength. Some conventional LNAs adjust the gain by tuning the bias current. However, when the bias voltage is changed, the LNA's linearity changes, and there is no control for this.

Other conventional LNAs employ an attenuation network to adjust the gain, which introduces additional noise. Still other conventional LNAs utilize a bypass topology to adjust the gain. The gain step is too large, and cannot be tuned smoothly.

Most conventional LNAs use a fixed transistor size. Once the topology is chosen and the size of the transistor is determined, it cannot be dynamically altered. This precludes many optimizations, such as smooth gain tuning, low noise and high linearity, and low power consumption.

SUMMARY

According to one or more embodiments, a configurable LNA architecture for a multi-band RF receiver front end comprises a bank of LNAs, each optimized to a different frequency band, wherein each LNA has a configurable topology. Each LNA comprises a plurality of amplifier stages, each stage including an RF transistor having a different width. By selectively enabling and disabling RF transistors, the effective transistor width of the LNA can be controlled with a fine granularity. A digital to analog converter (DAC) generates a bias voltage with a small quantization step, additionally providing a fine granularity of control. A high supply voltage provides the LNA with improved linearity, and overvoltage protection circuits shield transistors from a supply voltage in excess of their breakdown voltage. A source degeneration inductor presents a real resistance at input of the LNA for RF signal source impedance match, without introducing thermal noise.

One embodiment relates to a configurable, variable gain LNA connected to a power supply. The LNA includes RF input and output ports, and a plurality of amplifier stages connected in parallel between the RF input and output ports. Each amplifier stage includes an RF transistor having a different width and a control circuit operative to selectively enable or disable the amplifier stage. The LNA further includes a bias voltage generating circuit connected to all amplifier stages. A source degeneration inductor is connected to all amplifier stages, and presents a real resistance without thermal noise to match RF signal source impedance. A control input is connected to each amplifier stage control circuit. The gain of the LNA is controlled by selectively enabling the amplifier stages and altering the bias voltage.

Another embodiment relates to a multi-band low noise amplifier (LNA) bank. The LNA bank includes a plurality of selectively enabled, configurable, variable gain LNAs. Each LNA is operative over a different frequency range. Each LNA comprises radio frequency (RF) input and output ports and a plurality of amplifier stages connected in parallel between the RF input and output ports. Each amplifier stage includes an RF transistor having a different width and a control circuit operative to selectively enable or disable the amplifier stage. The LNA bank also includes a control input connected to each amplifier stage control circuit and a bias voltage generating circuit connected to all amplifier stages. The LNA bank further includes a source degeneration inductor connected to each LNA and operative to present a real resistance for matching RF signal source impedance without thermal noise to each amplifier stage.

Yet another embodiment relates to a method of amplifying a RF signal from a signal source. The RF signal is input to a configurable, variable gain low noise amplifier (LNA) comprising a plurality of amplifier stages connected in parallel. Each amplifier stage includes an RF transistor having a different width and a control circuit operative to selectively enable or disable the amplifier stage. The LNA is impedance matched to the signal source with a real resistance lacking thermal noise, generated by a source degeneration inductor connected to the LNA. One or more amplifier stages are selectively enabled to generate a desired effective RF transistor width. An amplified RF signal is output.

DETAILED DESCRIPTION

Figure 1:
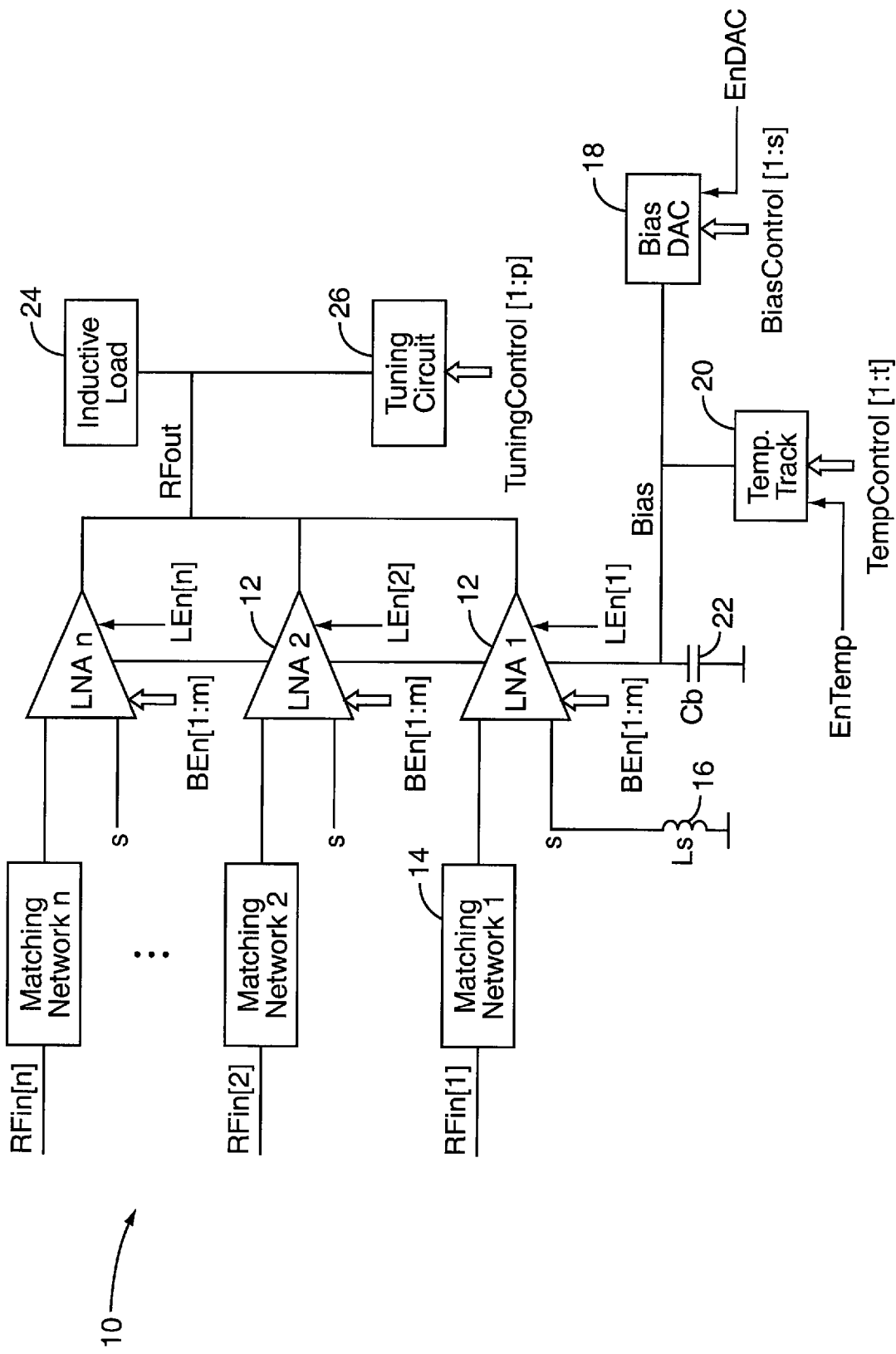
FIG. 1 is a functional block diagram of a multi-band RF receiver comprising a plurality of low noise amplifiers (LNA).

FIG. 1 depicts a configurable, multi-band RF receiver 10, which may, for example, be advantageously deployed in wireless communications systems. The multi-band RF receiver 10 comprises a plurality (i.e., from one to n) of low noise amplifiers (LNA), each amplifying a RF signal RFin[i] where i=1, 2, ..., n in a different frequency range. Each LNA 12 is separately enabled by a corresponding LEn[i] bit, only one of which will normally be set to logic high at a time. Each input signal RFin[i] is coupled to a corresponding LNA 12 through an impedance matching network 14. As discussed in greater detail herein, a source degeneration inductor 16 is converted to a real resistance to the input of LNA 12, without the thermal noise that occurs when the resistance is presented via resistive elements. A single source degeneration inductor 16 may be shared by all LNAs by connecting it to corresponding input nodes s at each LNA 12, or two or more separate source degeneration inductors 16 may be used, as required or desired for a particular implementation.

Each LNA 12 receives a common, multi-bit branch enable signal BEn[1:m] (where XX[1:x] is a digital control bus XX with x bits and represents XX[1], XX[2], .... XX[x], the same applies to similar designations hereinafter), which selectively enables and disables individual amplifier stages, or branches, within each LNA 12, as described in greater detail herein. A RF transistor bias voltage is generated in a bias DAC circuit 18 in response to a multi-bit digital Bias-Control [1:s] signal and an enable signal EnDAC. The signal BiasControl [1:s] may be arbitrarily wide, providing for an arbitrarily fine quantization step in adjusting the bias voltage, for smooth gain control.

An optional temperature tracking circuit 20 adjusts the bias voltage to compensate for temperature effects in response to a multi-bit digital TempControl [1:t] signal, the value of which is determined during a calibration procedure, and an enable signal EnTemp. A bias decoupling capacitor 22 removes crosstalk to the bias line. The bias voltage is distributed to all LNAs 12.

The output of the selected LNA 12, RFout, drives an inductive load 24, and the resonant frequency of which is adjusted by a tuning circuit 26 in response to a multi-bit digital TuningControl [1:p] signal.

Figure 2:
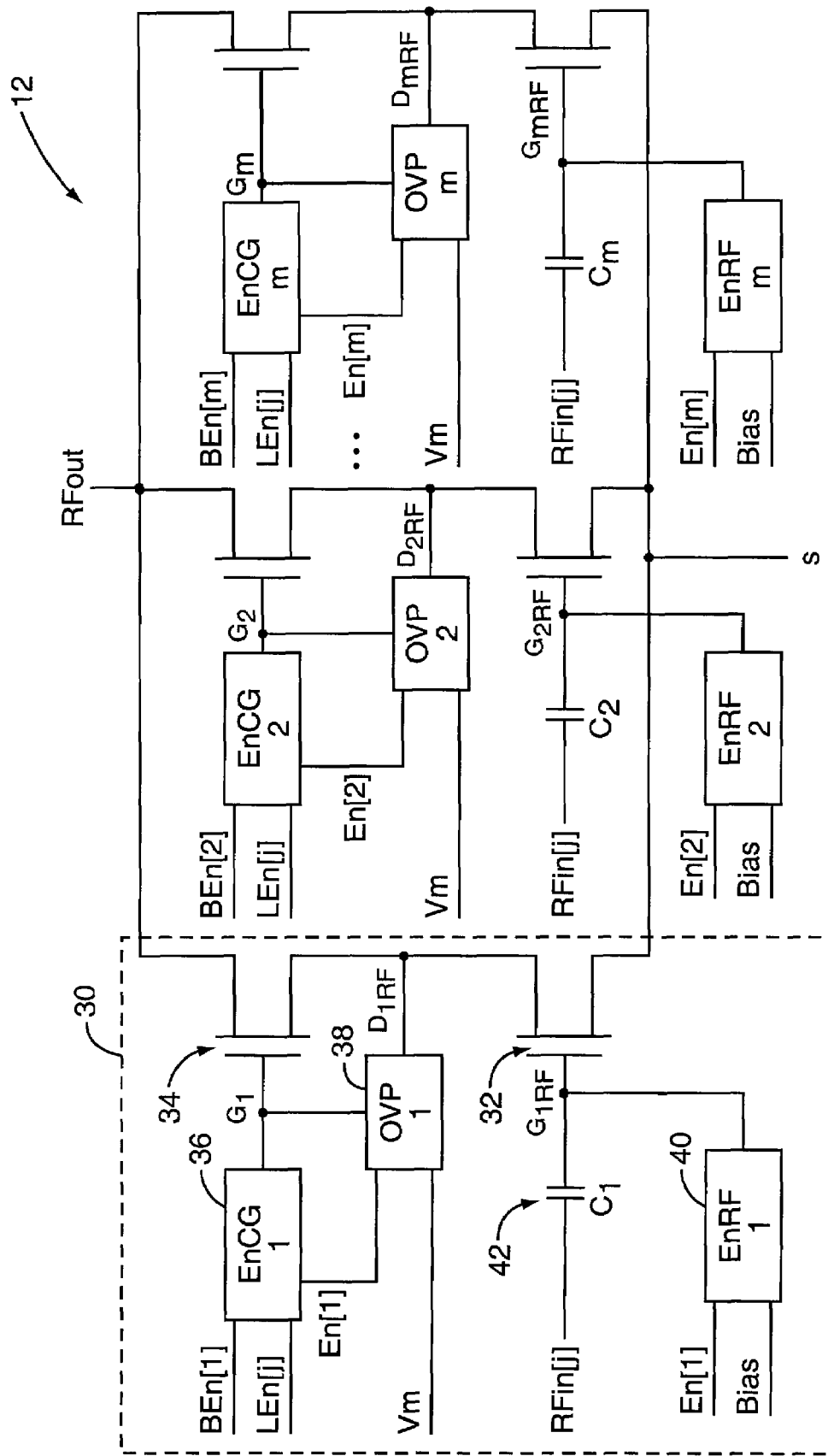
FIG. 2 is a functional block diagram of a LNA in the RF receiver of FIG. 1.

FIG. 2 depicts a LNA 12. As shown in FIG. 1, the LNA 12 has an RF input RFin[j], a LNA enable input LEn[j], branch enable inputs BEn[1], ... BEn[m], and a source degeneration inductor input node s. The LNA 12 outputs an RF signal at node RFout. The LNA 12 comprises a plurality of (m) amplifier stages, or branches 30, each stage 30 including an RF transistor 32 configured in common source and a common gate transistor 34 connected in series. The amplifier stages 30 may be selectively enabled or disabled in response to the control inputs BEn[1], ... BEn[m]. The RFout signal is taken at the drains of the common gate transistors of all enabled amplifier stages 30.

The widths of the transistors 32, 34 in each amplifier stage 30 are matched, and are different from the widths of transistors 32, 34 in other amplifier stages 30. In one embodiment, the widths of the transistors 32, 34 follow a binary weighted width, such that each successive, adjacent amplifier stage 30 includes transistors 32, 34 having twice the width of the prior stage 30, or $W_{i+1}=2W_i$, where i=1,2 ... m−1, for both the RF transistors 32 and the common gate transistors 34. In another embodiment, a constant scaling factor weighting is applied to the transistor sizing, such that the gain step between each successive, adjacent amplifier stage 30 is constant. That is, $$\frac{W_{k+1}}{W_k} = \frac{\sum_{i=0}^{k+1} w_i}{\sum_{i=0}^{k} w_i} = const.$$

where $w_i$ is the width of the transistors 32, 34 in the $i^{th}$ amplifier stage 30, and $W_k$ is the total width of transistors enabled in the gain step k.

Figure 3:
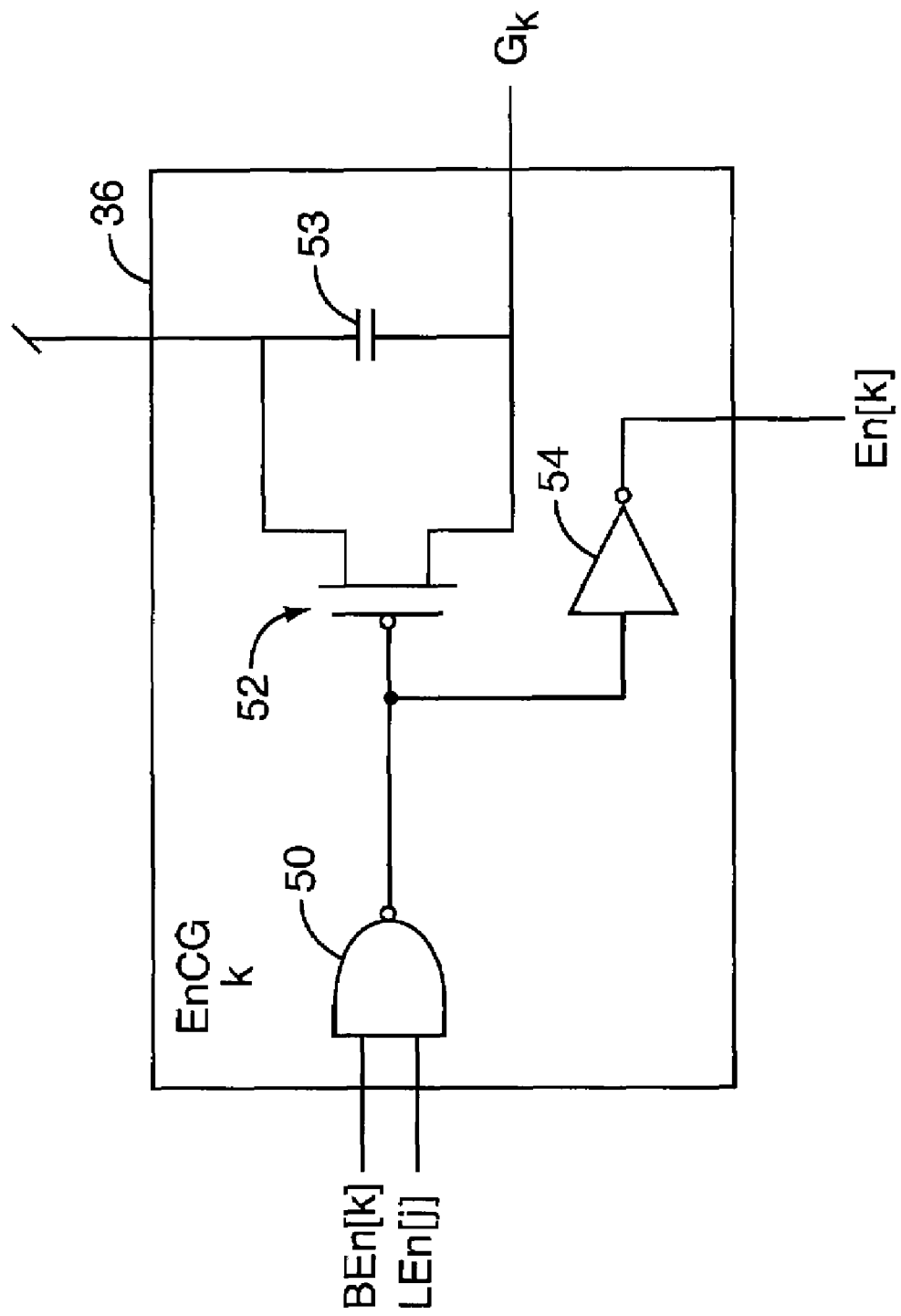
FIG. 3 is a functional block diagram of an enable circuit in the LNA of FIG. 2.

The common gate transistor 34 in each amplifier stage 30 is selectively enabled, in response to the LEn[j] and BEn[1:m] inputs, by the common gate transistor 34 enable circuit EnCG 36, depicted in greater detail in FIG. 3. The EnCG circuit 36 includes NAND gate logic 50 and a transistor 52 operative to disable the common gate transistor 34 by disconnecting its gate from $V_{dd}$ whenever LEn[j] and BEn[k] are not both logic high. The EnCG circuit 36 also includes inverter logic 54 to generate an amplifier stage 30 enable signal En[k] at output of the inverter logic 54. The capacitor 53 is connected to the power supply, and provides a good AC ground to the common gate transistor to reduce unwanted noise from biasing.

Figure 5:
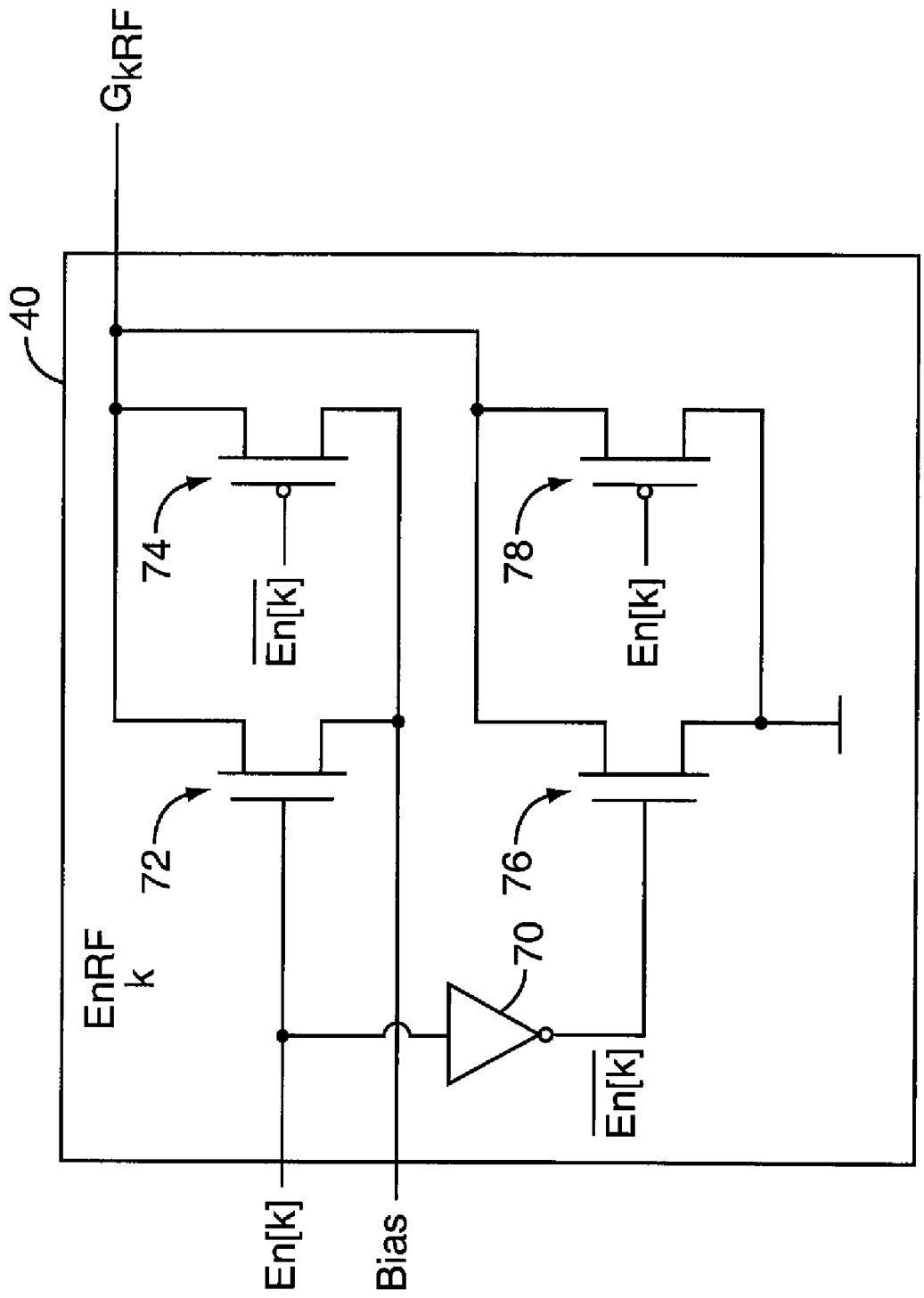
FIG. 5 is a functional block diagram of another enable circuit in the LNA of FIG. 2.

Returning to FIG. 2, the amplifier stage 30 enable signal En[k], along with a bias voltage Bias, are inputs to the RF transistor 32 enable circuit EnRF 40, depicted in greater detail in FIG. 5. If the En[k] signal is asserted (at a logic high level in the embodiment depicted in FIGS. 3 and 5), transistors 72, 74 connect the bias voltage to the gate ($G_{KRF}$) of the RF transistor 32. If the amplifier stage 30 is disabled and the En[k] signal is deasserted (at a logic low), transistors 72, 74 are turned off, to disconnect the bias voltage from the gate ($G_{KRF}$) of the RF transistor 32 and transistors 76, 78 are turned on to disable the RF transistor 32 by pulling its gate to ground. Referring again to FIG. 2, when an amplifier stage 30 is disabled, the gate of its RF transistor 32 is isolated by the capacitor 42 from the DC bias voltage provided to RF transistors 32 in other, enabled amplifier stages 30.

Figure 4:
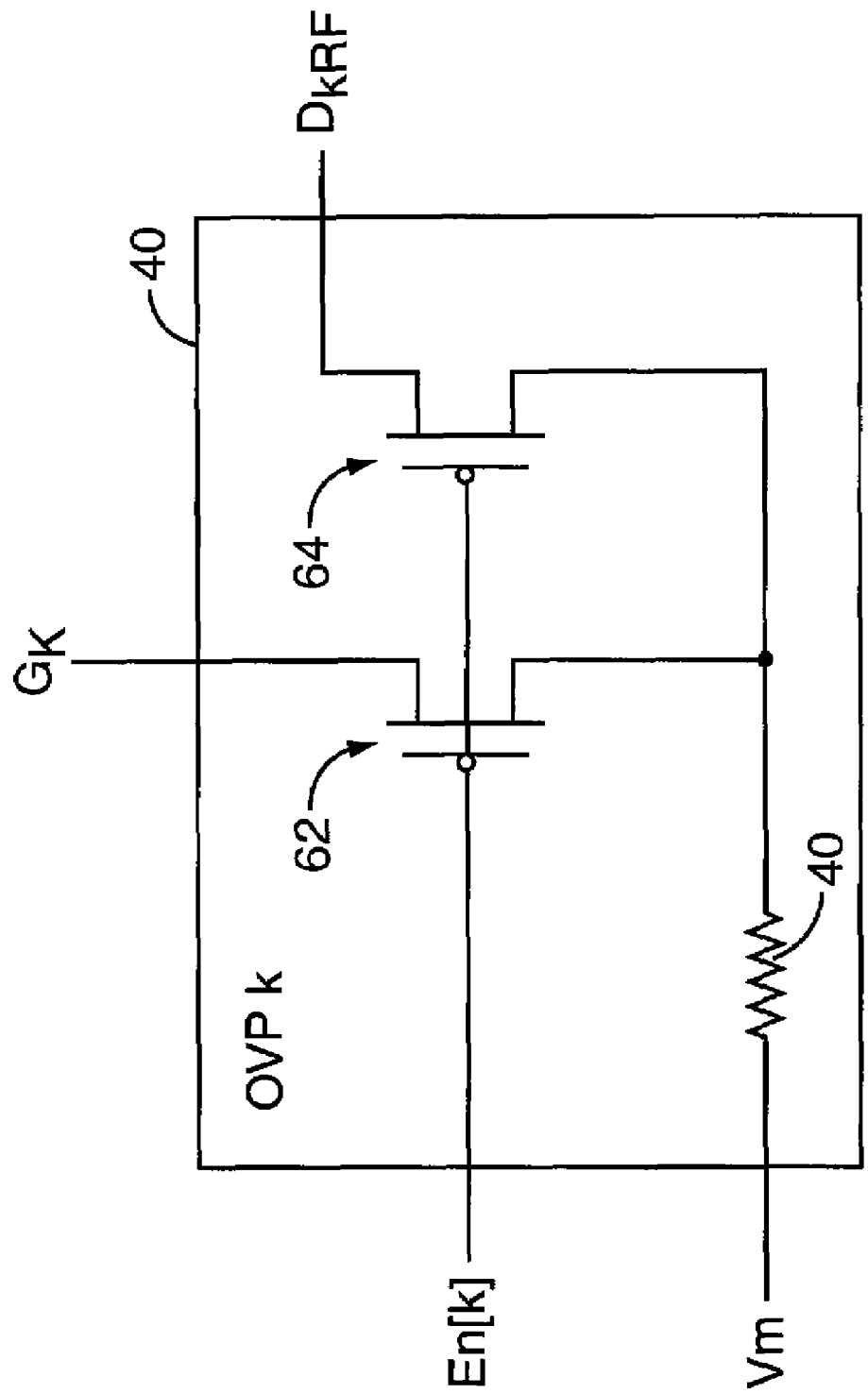
FIG. 4 is a functional block diagram of an overvoltage protection circuit in the LNA of FIG. 2.

Due to the inductive load 24 at the output of the LNA 12, the highest peak of an amplified RF signal RFout may exceed the supply voltage considerably, depending on the Q of the inductive load and input RF signal level. A proper supply voltage is selected to maintain the required linearity and gain, but not damage the transistors 32, 34 in enabled amplifier stages 30 in a LNA 12. However, this supply voltage may exceed the breakdown voltage of transistors 32, 34 in disabled amplifier stages 30. For example, the supply voltage may be 1.8V, and the breakdown voltage of transistors 32, 34 may be 1.2V. The overvoltage protection circuit OVP 38, depicted in greater detail in FIG. 4, protects transistors 32, 34 in disabled amplifier stages 30 from an excessive supply voltage. When the amplifier stage 30 enable signal En[k] is deasserted (logic low), transistor 62 pulls the gate ($G_K$) of the common gate transistor 34 to a voltage level $V_m$ which is intermediate to $V_{dd}$ and ground. Similarly, the transistor 64 pulls the drain ($D_{KRF}$) of the RF transistor 32 to $V_m$. Accordingly, both the transistors 32, 34 experience an effective drain-to-source voltage drop lower than the supply voltage $V_{dd}$. In one embodiment, $V_m$ may be selected near the midpoint of $V_{dd}$. A voltage source generating $V_m$ (not shown) preferably has a high output impedance, to reduce power consumption.

Figure 6:
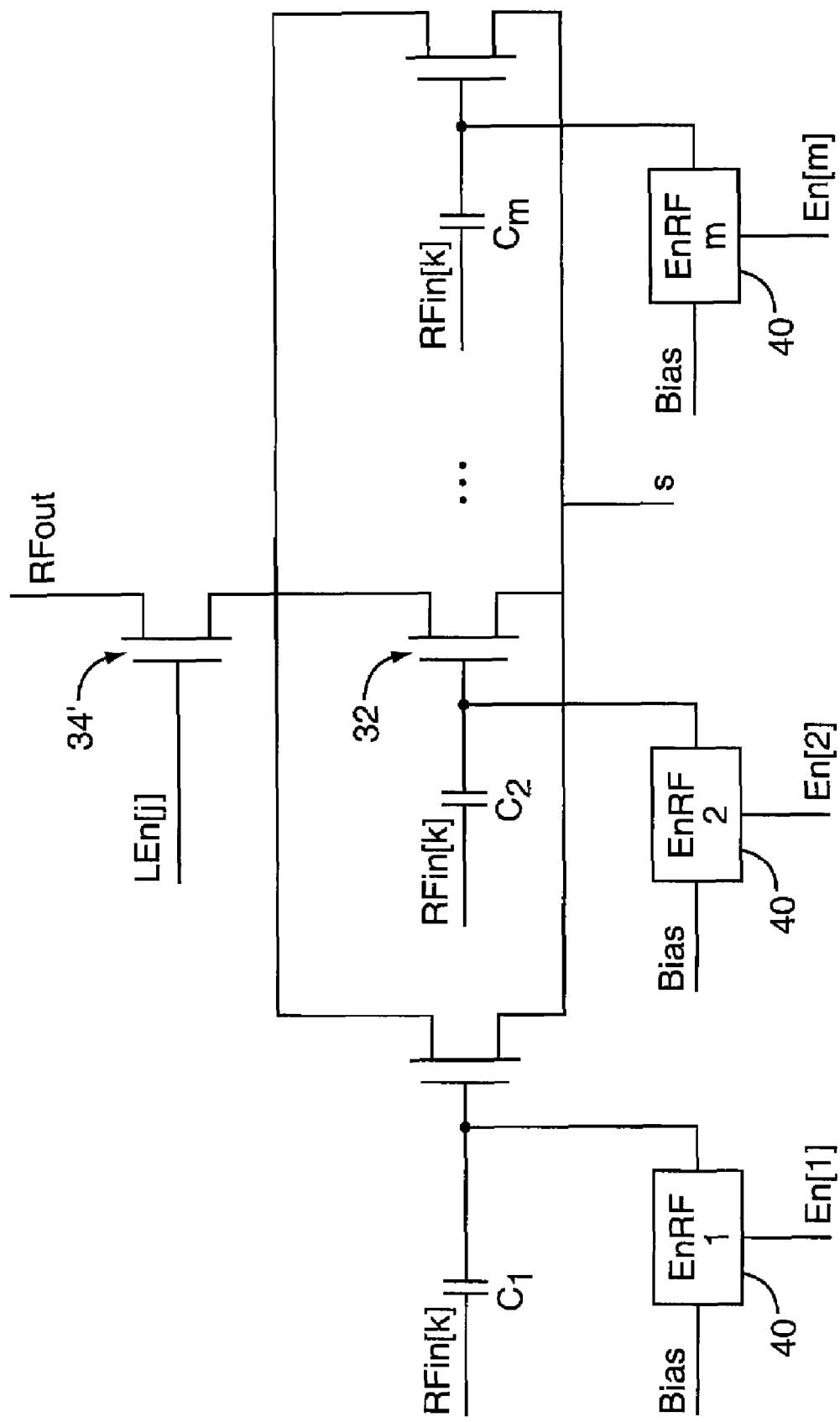
FIG. 6 is a functional block diagram of a second embodiment of a LNA in the RF receiver of FIG. 1.

FIG. 6 depicts another embodiment of the LNA 12. In this embodiment, the common gate transistors 34 of all amplifier stages 30 are merged into a single common gate transistor 34'. In this embodiment, the amplifier stages 30 are effectively the RF transistors 32, which are selectively enabled or disabled by the RF transistor 32 enable circuit EnRF 40, under the control of the amplifier stage enable signal En[k] (generated by a circuit similar to that of FIG. 3).

Figure 7:
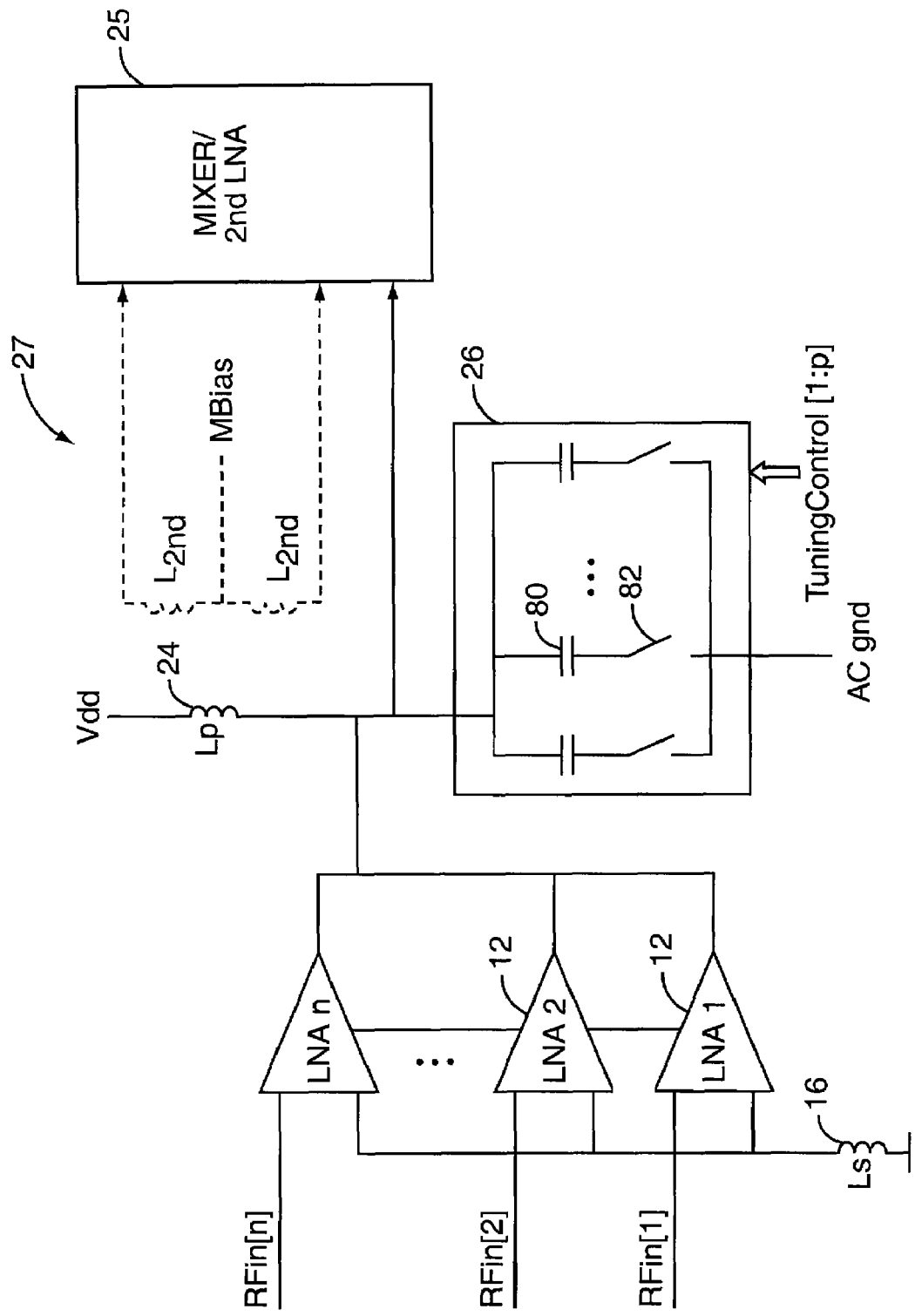
FIG. 7 is a functional block diagram of a tuning circuit in the RF receiver of FIG. 1.

As depicted in FIG. 1, all LNAs 12 in the multi-band receiver 10 share a single inductive load 24 and a tuning circuit 26. In the embodiment of FIG. 1, the LNAs 12 additionally share a single source degeneration inductor Ls 16, although in other embodiments various groups of one or more LNAs 12 may share a different source degeneration inductor 16. As depicted in FIG. 7, the inductive load may comprise a single inductor Lp 24, or the primary coil of a transformer such as a balun coupling the receiver 10 output RFout to a mixer or second stage LNA 25.

As also depicted in FIG. 7, the tuning circuit 26 may comprise a bank of capacitors 80, each connected in series with a transistor switch 82, which may comprise transmission gate or PMOS/NMOS transistor. The switches 82 are controlled by a p-bit wide digital input TuningControl [1:p]. In one embodiment, both the capacitors 80 and the width of the switches 82 are binary weighted. The capacitors may be switched into or out of the tuning circuit 26 to resonate with the inductive load 24 at a particular frequency, boosting the gain at that frequency.

Figure 8A:
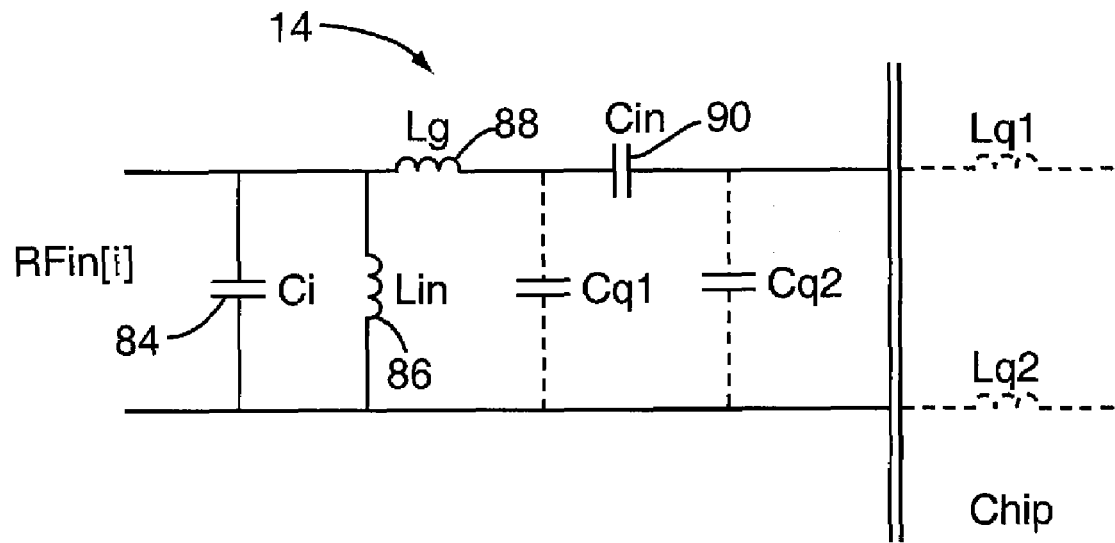
FIGS. 8A and 8B are circuit diagrams of matching networks in the RF receiver of FIG. 1.
Figure 8B:
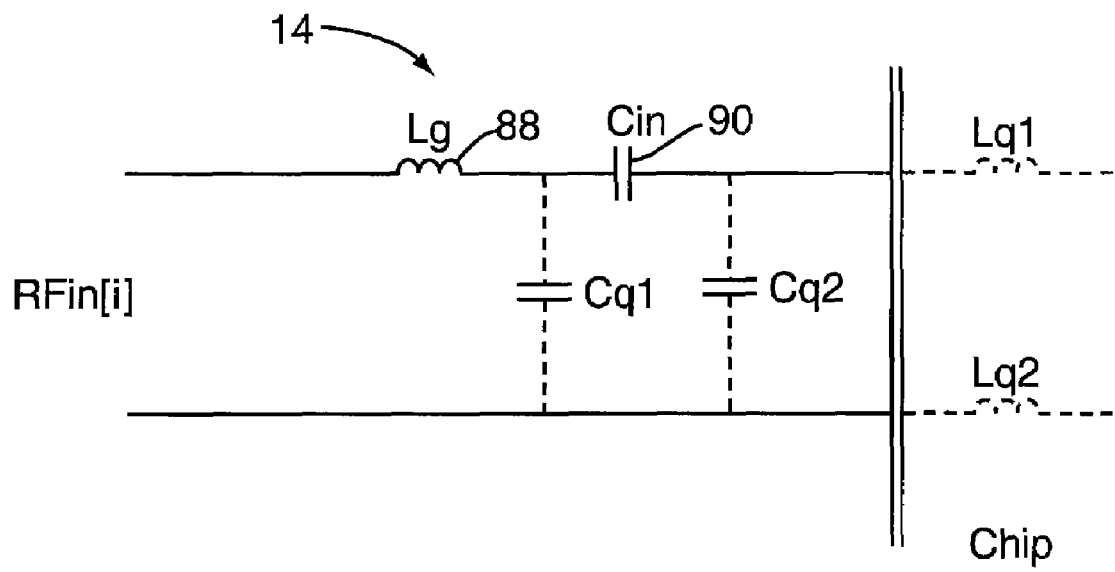

FIGS. 8A and 8B depict two embodiments of the input matching network 14 depicted in FIG. 1. In both figures, $L_{q1}$ and $L_{q2}$ are parasitic inductors associated with an integrated circuit package, such as bond wires or other package-introduced inductance. Similarly, $C_{q1}$ and $C_{q2}$ are parasitic capacitors related to board and package implementation. Capacitor $C_{in}$ 90 is an input AC coupling capacitor.

In FIG. 8A, an input inductor $L_{in}$ 86 and optionally an input capacitor $C_i$ 84 are connected in shunt. In this embodiment, inductors $L_{in}$ 86 and $L_g$ 88 form a self-coupling transformer that introduces some voltage gain. The embodiment of FIG. 8A may find particular utility in high frequency ranges, where ESD protection and package introduced capacitance can be tuned at resonate frequency. This matching network 14 also provides increased flexibility to tune the circuit. The matching network 14 of FIG. 8B, without the input inductor $L_{in}$ 86, exhibits less noise, but also has less gain than the embodiment of FIG. 8A. This embodiment may advantageously be employed at lower frequencies.

Figure 9:
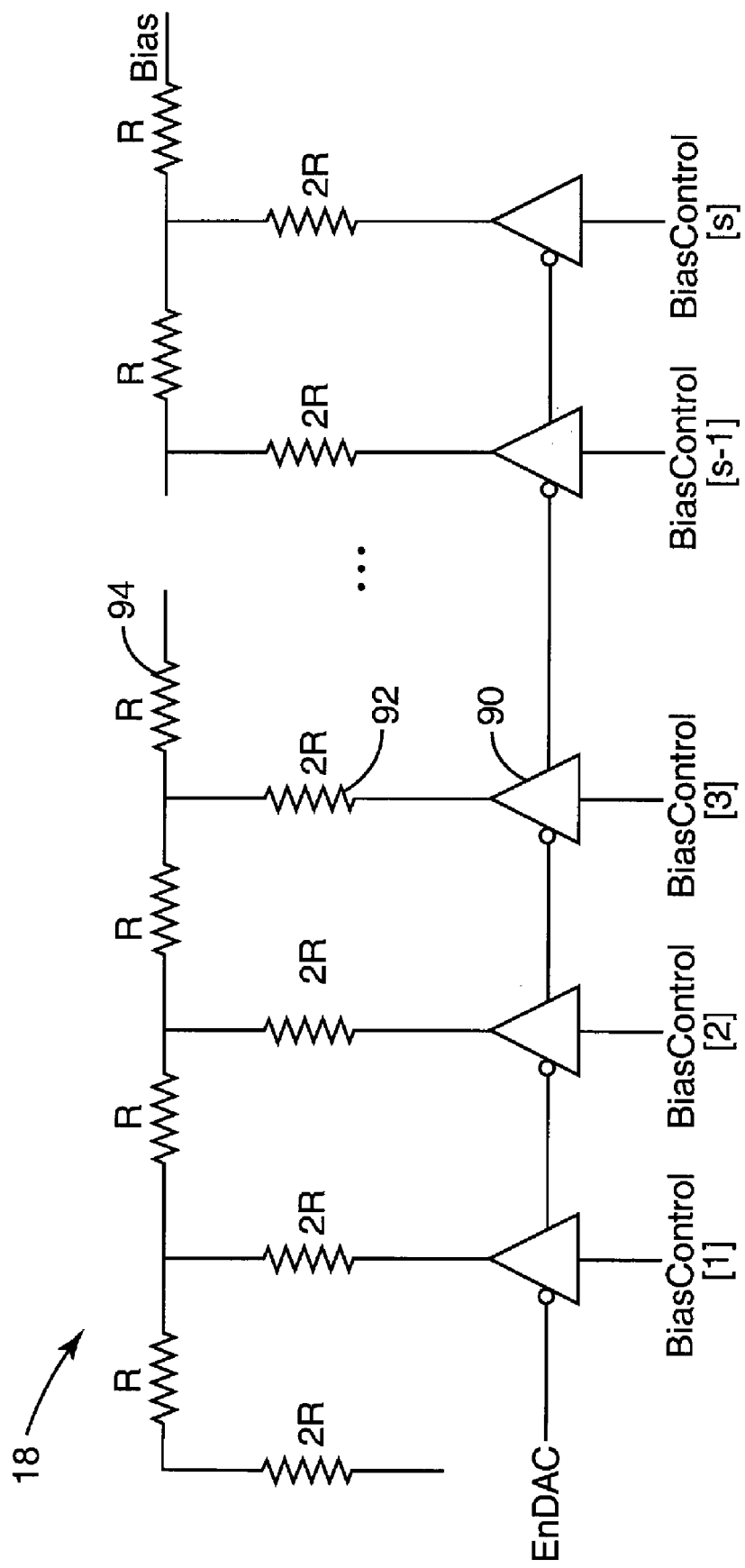
FIG. 9 is a functional block diagram of a bias voltage generating circuit in the RF receiver of FIG. 1.

FIG. 9 depicts the bias DAC circuit 18. The circuit is a Digital-to-Analog Converter (DAC) comprising a plurality of drivers 90 connected to a R-2R resister ladder. The driver 90 inputs are the bits of the BiasControl [1:s] control bus, and the DAC is enabled by the EnDAC signal.

Figure 10:
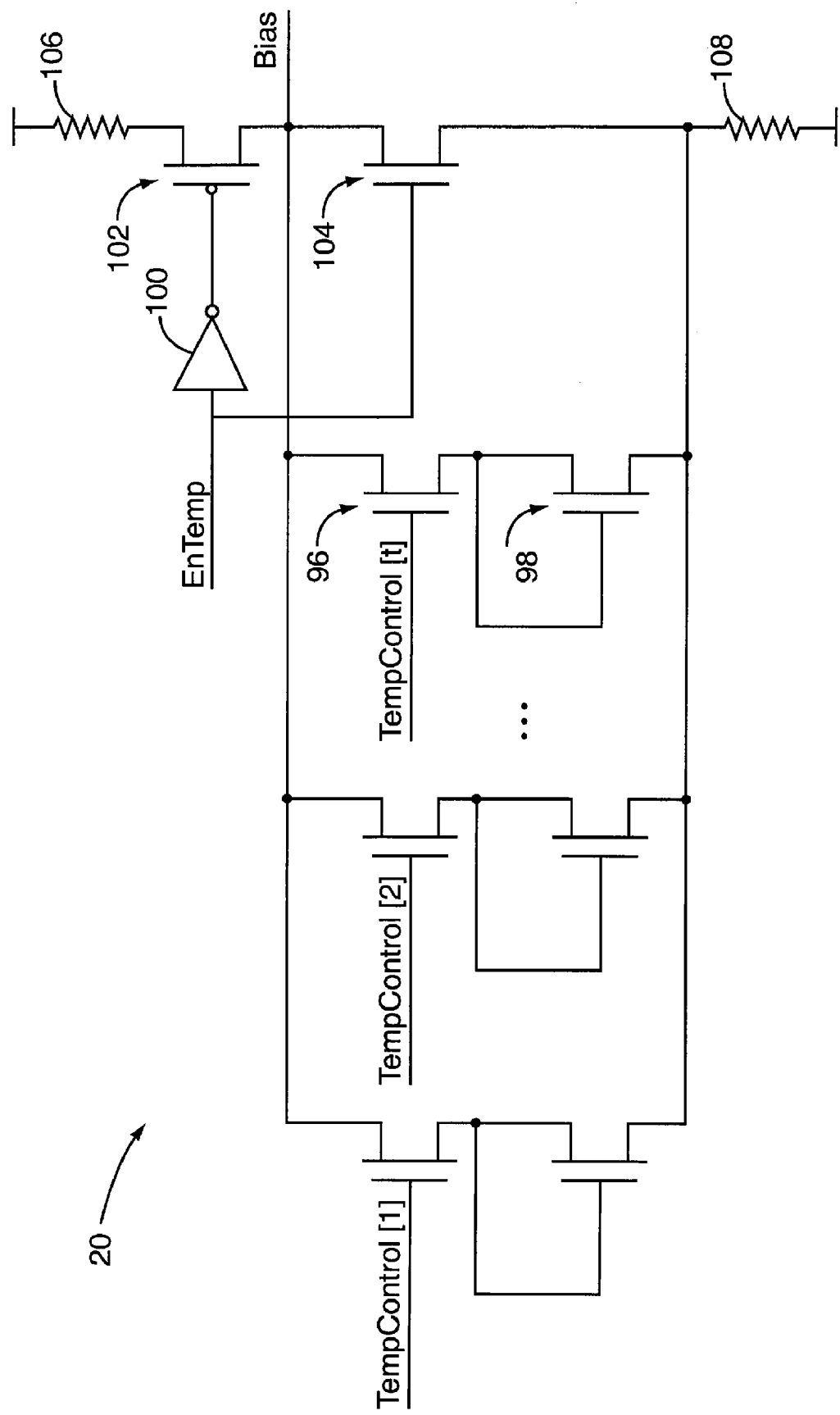
FIG. 10 is a functional block diagram of a temperature compensation circuit in the RF receiver of FIG. 1.

FIG. 10 depicts the optional temperature tracking circuit 20 which compensates for current changes caused by temperature change. The TempControl [1:t] bus selectively enables or disables transistors 96, switching temperature tracking transistors 98 into or out of the circuit 20. The temperature tracking transistors 98 have different transistor lengths and widths. The best temperature tracking transistor 98 may be selected based on process variation in a calibration procedure, such as during an initialization process. When the TempControl [1:t] bus is all zero, the temperature tracking circuit 20 is disabled. If the control signal EnTemp is asserted, the transistors 102 and 104 conduct, creating a voltage divider network between the resisters 106, 108, forming a coarse bias voltage, which may be tuned with the bias voltage generated by the bias DAC circuit 18.

Figure 11:
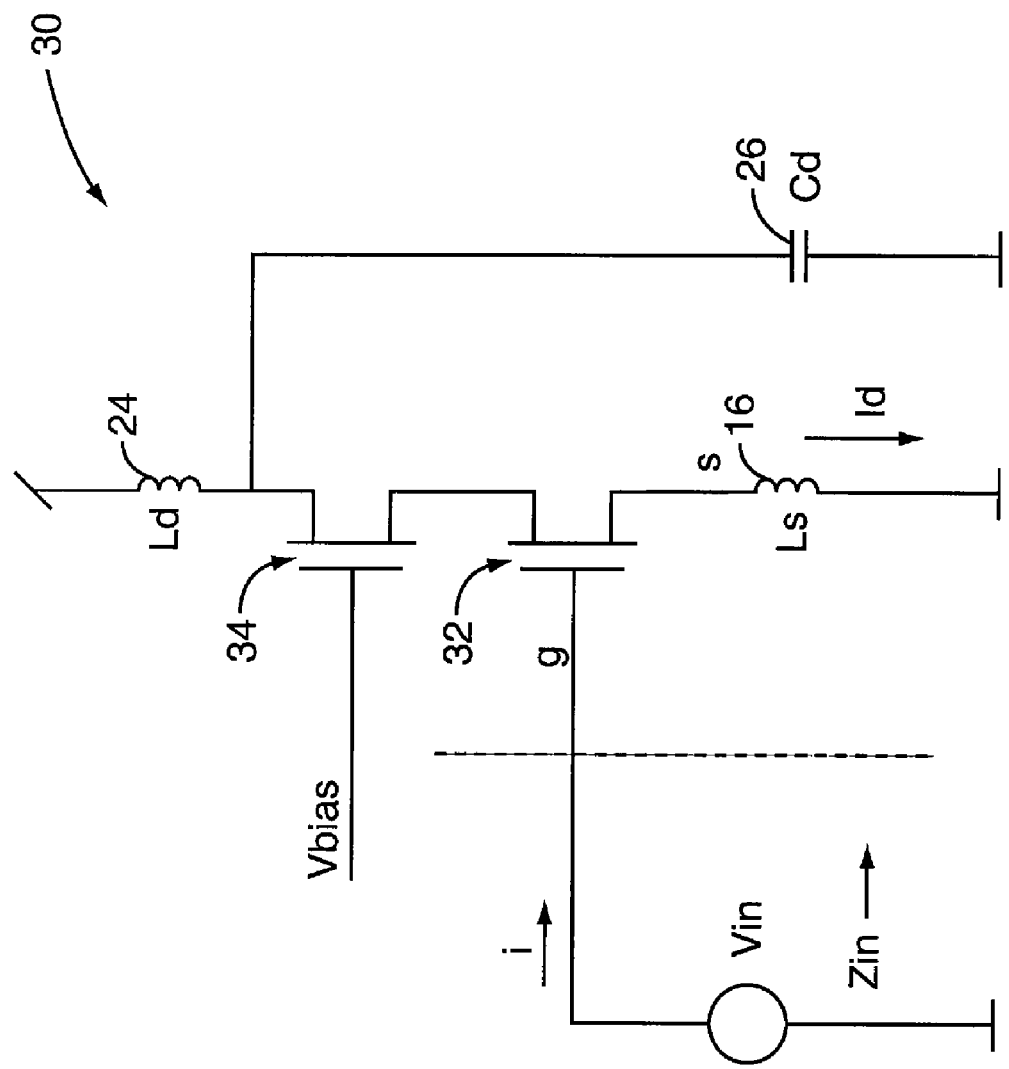
FIG. 11 is a circuit diagram of an amplifier stage depicting the operation of the source degeneration inductor in the RF receiver of FIG. 1.

Operation of the source degeneration inductor 16 is described with respect to FIG. 11, depicting a representative LNA 12 amplifier stage 30. The input impedance of the amplifier stage 30 is $Z_{in}$, which can be expressed as:

$$Zin = \frac{1}{sCgs} + \omega_T Ls$$

where $$\omega_T = \frac{gm}{Cgs}$$

is the cut-off frequency of the MOS transistor, Cgs is the gate-source capacitance of the RF transistor.

The second term of $Z_{in}$ is physically a product of frequency and inductance $L_s$, giving the property of real resistance. This resistance is created by the source degeneration effect, and it appears at the gate of the RF transistor. A pure inductance will not have thermal noise; hence the created resistance is also free from thermal noise. Using this resistance to match the impedance of the signal source avoids the 3 dB noise factor degradation encountered using a real resistor. However, it provides the real resistance match required for the input impedance matching network. Poor impedance matching would reduce the signal source power passed to the gate of the RF transistor 32, decreasing the gain. Accordingly, use of the source degeneration inductor 16 maximizes the gain of an LNA 12 while minimizing the noise.

The present invention presents numerous advantages over conventional LNAs. By selectively enabling one or more amplifier stages 30, each having transistors 32, 34 of different widths, the effective total width of the LNA 12 may be dynamically altered, and optimized to the receiving environment and required gain and power consumption.

At some RF frequencies, noise performance in a LNA is a function of transistor width and bias voltage. For advanced CMOS technology, flicker noise will influence the noise figure. At a lower RF frequency, a wider transistor width can reduce the impact of flicker noise. At a higher RF frequency, however, more overdrive voltage is normally required to achieve sufficient transconductivity from a LNA, and the optimum transistor size for achieving the lowest noise figure is less than at a lower RF frequencies. With the configurable topology for a LNA 12 as depicted in FIG. 2, the minimum noise can be achieved by tuning the bias voltage and the number of amplifier stages 30.

The ability to vary effective transistor width by selectively enabling amplifier stages 30, together with a bias DAC 18 having a wide control word width, and hence small quantization steps, allows for smooth control of the gain over a wide frequency range. When the RFin signal is received with a moderate or high power level, some of the amplifier stages 30 may be disabled, reducing power consumption and additionally avoiding the degradation in noise performance inherent in conventional attenuation methods, such as resistor networks.

In the presence of interference, high linearity is required. Improved linearity requires greater overdrive voltage, which can be achieved by increasing the bias voltage either keeping the same number of amplifier stages 30 enabled, or reducing the number of amplifier stages 30. Over voltage protection circuits protect the transistors 32, 34 in disabled amplifier stages 30 from breakdown damage. Accordingly, the LNA 12 linearity may be improved in the presence of strong interference.

Figure 12:
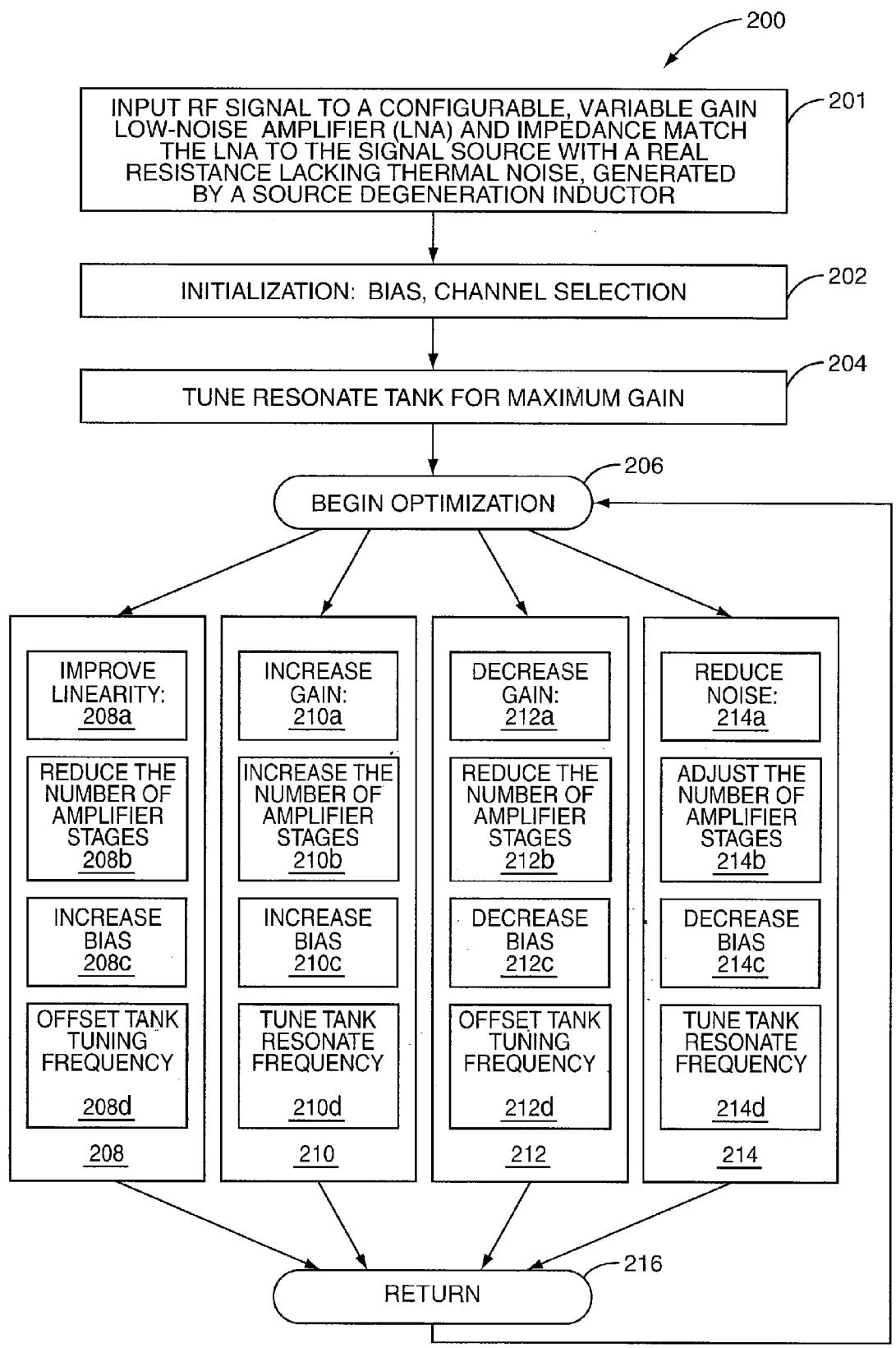
FIG. 12 is a flow diagram of a method of amplifying a RF signal.

FIG. 12 depicts a method 200 of amplifying a RF signal from a signal source and optimizing the amplifier 12 along these various parameters. The method 200 begins by inputting the RF signal to a receiver 10 comprising at least one configurable, variable gain LNA 12 which is impedance matched to the signal source with a real resistance lacking thermal noise, generated by a source degeneration inductor 16 (block 201). A channel is selected by enabling one configurable, variable gain LNA 12, such as by asserting one bit of the LEn[n] bus, and setting a bias voltage, such as by adjusting the Bias DAC circuit 18 via the BiasControl[1:s] bus (block 202). The output of the LNA 12 is tuned to resonate with an inductive load 24 to maximize the gain, such as by adjusting a tuning circuit 26 via the TuningControl [1:p] bus (block 204).

The enabled configurable, variable gain LNA 12 comprises a plurality of amplifier stages 30 connected in parallel, each amplifier stage 30 including an RF transistor 32 having a different width and a control circuit 36, 40, 42 operative to selectively enable or disable the amplifier stage 30. Based on the performance desired, the LNA 12 operation may be optimized along a variety of parameters (block 206). For example, to improve linearity (block 208), the number of active amplifier stages 30 may be selectively reduced, such as by disabling amplifier stages 30 via the BEn[1:m] bus (block 208b). The bias voltage output of the Bias DAC circuit 18 may be increased by adjusting the BiasControl[1:s] bus (block 208c); and the resonant tuning frequency may be offset by adjusting the TuningControl[1:p] bus to alter the output capacitance of the Tuning Circuit 26 (block 208d). Note that the method steps 208b, 208c, and 208d may be performed in any order, as required or desired, and the adjustments may be iterative. At block 216, control returns to block 206 for possible further optimization of the LNA 12.

The LNA 12 may be optimized to increase the gain (block 210) by increasing the number of active amplifier stages 30 via the BEn[1:m] bus (block 210b); increasing the bias voltage by adjusting the BiasControl[1:s] bus (block 210c); and adjusting the resonant tuning frequency by adjusting the TuningControl[1:p] bus (block 210d). Alternatively, the LNA 12 may be optimized to decrease the gain (block 212) by reducing the number of active amplifier stages 30 via the BEn[1:m] bus (block 212b); decreasing the bias voltage by adjusting the BiasControl[1:s] bus (block 212c); and adjusting the resonant tuning frequency by adjusting the TuningControl[1p] bus (block 212d).

Additionally, the LNA 12 may be optimized to reduce noise (block 214) by adjusting the number of active amplifier stages 30 via the BEn[1:m] bus (block 214b); decreasing the bias voltage by adjusting the BiasControl[1:s] bus (block 214c); and adjusting the resonant tuning frequency by adjusting the TuningControl[1:p] bus (block 214d).

The configurability along multiple parameters provides a LNA 12 that may be optimized for minimum noise, maximum gain, best linearity, lowest power consumption, or various trade-offs between these goals. A temperature compensation for bias may be selectively enabled, as required by the receiving environment.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A configurable, variable gain low noise amplifier (LNA) connected to a power supply, the LNA comprising:
   radio frequency (RF) input and output ports;
   a plurality of amplifier stages connected in parallel between the RF input and output ports, each amplifier stage including an RF transistor having a different width and a control circuit operative to selectively enable or disable the amplifier stage;
   a bias voltage connected to all amplifier stages;
   a source degeneration inductor connected to all amplifier stages and operative to present a real resistance without thermal noise at a gate input of each RF transistor; and
   a control input connected to each amplifier stage control circuit.

2. The LNA of claim 1 whereby the gain of the LNA is controlled by selectively enabling the amplifier stages and altering the bias voltage.

3. The LNA of claim 1 wherein the width of the RF transistor in each successive, adjacent amplifier stage is twice that of the RF transistor in the preceding amplifier stage.

4. The LNA of claim 1 wherein the width of the RF transistor in each successive, adjacent amplifier stage is sized so as to produce a constant increase in gain as each adjacent amplifier stage is enabled.

5. The LNA of claim 1 wherein each amplifier stage further comprises a common gate transistor connected in series between the RF transistor and the RF output port, the common gate transistor having a width matched to the width of the RF transistor.

6. The LNA of claim 5 wherein each amplifier stage further includes an overvoltage protection circuit operative to expose the transistors to a voltage below a breakdown voltage of the transistor when the amplifier stage is disabled.

7. The LNA of claim 6 wherein the overvoltage protection circuit comprises a circuit operative to pull the gate and source of the common gate transistor to a voltage intermediate to the power supply voltage and ground.

8. The LNA of claim 1 wherein each amplifier stage further comprises a capacitor in series between the RF input port and the gate of the RF transistor.

9. The LNA of claim 1 wherein outputs of each amplifier stage are connected together, and further comprising a transistor connected in series between the common amplifier stage output and the RF output port.

10. The LNA of claim 1 wherein the control circuit is operative to selectively enable or disable the amplifier stage by selectively coupling the gate of the RF transistor to a bias voltage or to ground.

11. The LNA of claim 1 further comprising an inductive load connected between the RF output port and the power supply.

12. The LNA of claim 11 wherein the load inductor comprises the primary winding of a balun.

13. The LNA of claim 11 further comprising a tuning circuit connected between the RF output port and AC ground, the tuning circuit comprising a plurality of capacitors connected in parallel, each capacitor selectively coupled to AC ground by a switch connected in series to the capacitor.

14. The LNA of claim 13 wherein the resonant frequency of the LNA is adjusted by selectively actuating the tuning circuit switches.

15. The LNA of claim 1 further comprising an input impedance matching network, comprising a series connected inductor and capacitor, connected between an input signal and the RF input port.

16. The LNA of claim 15 wherein the input impedance matching network further comprises an inductor and a capacitor connected in parallel between the input signal and ground.

17. The LNA of claim 1 further comprising a bias voltage generating circuit receiving a digital control input, comprising:
   a driver receiving each control bit; and
   a resistor ladder comprising resistors of value 2R connected to the output of each driver, and resistors of value R connected between the 2R resistors; and
   a resistor of value R connected between the last ladder stage and a bias voltage output.

18. The LNA of claim 17 further comprising a temperature tracking circuit operative to optionally compensate the output of the bias voltage generating circuit for temperature induced current changes, comprising a plurality of temperature tracking transistors connected in parallel, each having a different length and width, each temperature tracking transistor connected in series with an enable transistor operative to selectively enable or disable the temperature tracking transistor in response to a control input.

19. The LNA of claim 18 wherein the temperature tracking circuit further comprises a resistor divider network generating a bias voltage, the resistors each serially connected to a switching element operative to selectively enable or disable the resistor divider network.

20. A multi-band low noise amplifier (LNA) bank, comprising:
   a plurality of selectively enabled, configurable, variable gain LNAs, each operative over a different frequency range, each LNA comprising radio frequency (RF) input and output ports and a plurality of amplifier stages connected in parallel between the RF input and output ports, each amplifier stage including an RF transistor having a different width and a control circuit operative to selectively enable or disable the amplifier stage;
   a control input connected to each amplifier stage control circuit;
   a bias voltage generating circuit connected to all amplifier stages; and
   a source degeneration inductor connected to each LNA and operative to present a real resistance without thermal noise at the RF input port of each LNA.

21. The LNA bank of claim 20 wherein the widths of RF transistors in adjacent amplifier stages are sized with a binary weighting.

22. The LNA bank of claim 20 wherein the widths of RF transistors in adjacent amplifier stages are sized to produce a constant gain step.

23. The LNA bank of claim 20 wherein the gain of the LNA is controlled by selectively enabling the amplifier stages and altering the bias voltage.

24. The LNA bank of claim 20 wherein all LNAs in the bank share a source degeneration inductor.

25. The LNA bank of claim 20 wherein a group of one or more LNAs share a separate source degeneration inductor.

26. The LNA bank of claim 20 wherein all LNAs in the bank share a bias voltage generating circuit.

27. The LNA bank of claim 26 further comprising a temperature compensation circuit operative to adjust a bias voltage for temperature effects.

28. The LNA bank of claim 20 further comprising an inductive load and a configurable tuning circuit comprising a plurality of capacitors connected in parallel, each capacitor having a switch connected in series and operative to enable or disable the capacitor in response to a digital control input.

29. The bank of claim 28 wherein the capacitors are sized with a binary weighting.

30. A method of amplifying a RF signal from a signal source, comprising:
   inputting the RF signal to a configurable, variable gain low noise amplifier (LNA) comprising a plurality of amplifier stages connected in parallel, each amplifier stage including an RF transistor having a different width and a control circuit operative to selectively enable or disable the amplifier stage;
   impedance matching the LNA to the signal source with a real resistance lacking thermal noise, generated by a source degeneration inductor connected to the LNA;
   selectively enabling one or more amplifier stages to generate a desired effective RF transistor width; and
   outputting an amplified RF signal.

31. The method of claim 30 further comprising adjusting a bias voltage applied to each enabled amplifier stage to adjust the LNA gain.

32. The method of claim 31 further comprising adjusting the bias voltage to compensate for temperature.

33. The method of claim 30 further comprising tuning a tuning circuit to resonate with an inductive load at a desired frequency.

34. The method of claim 30 further comprising adjusting a bias voltage applied to the LNA to maintain linearity.

35. The method of claim 30 further comprising inputting the RF signal to a plurality of configurable, variable gain LNAs, and selectively enabling one of the LNAs.

36. The method of claim 35 wherein each LNA is optimized to a predetermined frequency range.

37. The method of claim 35 wherein impedance matching each LNA comprises connecting the source degeneration inductor to an input of each LNA.

38. The method of claim 35 further comprising a plurality of source degeneration inductors, and wherein impedance matching each LNA comprises connecting a separate source degeneration inductor to an input of each LNA.

* * * * *

UNITED STATES PATENT AND TRADEMARK OFFICE
CERTIFICATE OF CORRECTION

PATENT NO. : 7,486,135 B2 Page 1 of 1
APPLICATION NO. : 11/754696
DATED : February 3, 2009
INVENTOR(S) : Mu It is certified that error appears in the above-identified patent and that said Letters Patent is hereby corrected as shown below:

In Column 1, Line 57, delete "μn" and insert -- $\mu_n$ --, therefor.

In Column 6, Line 37, in Equation, delete "Zin" and insert -- $Z_{in}$ --, therefor.

In Column 8, Line 8, delete "TuningControl[1p]" and insert -- TuningControl[1:p] --, therefor.

Signed and Sealed this

Twenty-sixth Day of May, 2009

JOHN DOLL
*Acting Director of the United States Patent and Trademark Office*